United States Patent
Giusti et al.

(10) Patent No.: US 11,560,886 B2
(45) Date of Patent: Jan. 24, 2023

(54) MICROPUMP MEMS DEVICE FOR MOVING OR EJECTING A FLUID, IN PARTICULAR MICROBLOWER OR FLOWMETER

(71) Applicant: STMICROELECTRONICS S.R.L., Agrate Brianza (IT)

(72) Inventors: Domenico Giusti, Caponago (IT); Lorenzo Baldo, Bareggio (IT); Enri Duqi, Milan (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 339 days.

(21) Appl. No.: 16/847,521

(22) Filed: Apr. 13, 2020

(65) Prior Publication Data

US 2020/0325888 A1 Oct. 15, 2020

(30) Foreign Application Priority Data

Apr. 15, 2019 (IT) .................. 102019000005808

(51) Int. Cl.
*F04B 43/04* (2006.01)
*H01L 27/20* (2006.01)
(Continued)

(52) U.S. Cl.
CPC .......... *F04B 43/046* (2013.01); *F04B 43/026* (2013.01); *F04B 45/047* (2013.01);
(Continued)

(58) Field of Classification Search
CPC .... F04B 19/006; F04B 43/043; F04B 43/046; F04B 43/026; F04B 43/095; F04B 45/047; H01L 27/20; H01L 41/31; B81C 1/00119
(Continued)

(56) References Cited

U.S. PATENT DOCUMENTS 5,585,011 A * 12/1996 Saaski .................. F04B 43/043
216/33
7,344,907 B2 3/2008 Colgan et al.
(Continued)

FOREIGN PATENT DOCUMENTS

CN 101542122 A 9/2009
CN 104249990 A 12/2014
(Continued)

OTHER PUBLICATIONS

Fischer et al., "Integrating MEMS and ICs", Microsystems & Nanoengineering, (2015) 1, 15005, 16 pages.

*Primary Examiner* — Kenneth J Hansen
(74) *Attorney, Agent, or Firm* — Seed IP Law Group LLP

(57) ABSTRACT

A micropump device is formed in a monolithic semiconductor body integrating a plurality of actuator elements arranged side-by-side. Each actuator element has a first chamber extending at a distance from a first face of the monolithic body; a membrane arranged between the first face and the first chamber; a piezoelectric element extending on the first face over the membrane; a second chamber, arranged between the first chamber and a second face of the monolithic body; a fluidic inlet path fluidically connecting the second chamber with the outside of the monolithic body; and a fluid outlet opening extending in a transverse direction in the monolithic body from the second face as far as the second chamber, through the first chamber. The monolithic formation of the actuator elements and the possibility of driving the actuator elements at different voltages enable precise adjustment of flows, from very low values to high values.

20 Claims, 5 Drawing Sheets

(51) Int. Cl.
    *H01L 41/047*      (2006.01)
    *H01L 41/09*      (2006.01)
    *H01L 41/31*      (2013.01)
    *F04B 43/02*      (2006.01)
    *F04B 45/047*      (2006.01)

(52) U.S. Cl.
    CPC ............ *H01L 27/20* (2013.01); *H01L 41/047* (2013.01); *H01L 41/0973* (2013.01); *H01L 41/31* (2013.01)

(58) Field of Classification Search
    USPC .................................................. 438/422, 429
    See application file for complete search history.

(56) References Cited

U.S. PATENT DOCUMENTS

| | | |
|---|---|---|
| 7,767,484 B2 | 8/2010 | Ayazi |
| 7,928,960 B2 | 4/2011 | Baldo et al. |
| 8,173,513 B2 | 5/2012 | Villa et al. |
| 8,633,553 B2 | 1/2014 | Ferrera et al. |
| 9,233,834 B2 | 1/2016 | Faralli et al. |
| 9,688,531 B2 | 6/2017 | Baldo et al. |
| 2005/0208696 A1 | 9/2005 | Villa et al. |
| 2006/0203326 A1 | 9/2006 | Fu |
| 2008/0224242 A1 | 9/2008 | Villa et al. |
| 2009/0115008 A1 | 5/2009 | Ziglioli et al. |
| 2009/0232683 A1* | 9/2009 | Hirata .................. F04B 45/047 417/413.2 |
| 2010/0096714 A1 | 4/2010 | Nakatani |
| 2010/0164025 A1 | 7/2010 | Yang et al. |
| 2010/0284553 A1 | 11/2010 | Conti et al. |
| 2010/0330721 A1 | 12/2010 | Barlocchi et al. |
| 2012/0018819 A1 | 1/2012 | Ferrera et al. |
| 2014/0299949 A1 | 10/2014 | Conti et al. |
| 2014/0313264 A1 | 10/2014 | Cattaneo et al. |
| 2015/0001645 A1 | 1/2015 | Faralli et al. |
| 2015/0001651 A1 | 1/2015 | Faralli et al. |
| 2015/0059749 A1* | 3/2015 | Nitta ................. A61M 16/0063 128/204.18 |
| 2015/0071797 A1 | 3/2015 | Takeuchi |
| 2016/0119722 A1 | 4/2016 | Chu et al. |
| 2016/0167945 A1 | 6/2016 | Chang et al. |
| 2016/0318757 A1 | 11/2016 | Chou et al. |
| 2017/0001857 A1 | 1/2017 | Jeong et al. |
| 2017/0021391 A1 | 1/2017 | Guedes et al. |
| 2017/0144881 A1 | 5/2017 | Baldo et al. |
| 2017/0190179 A1* | 7/2017 | Menzel ................. B41J 2/14233 |
| 2017/0253477 A1 | 9/2017 | Baldo et al. |
| 2018/0127263 A1 | 5/2018 | Tai et al. |
| 2020/0325888 A1 | 10/2020 | Giusti et al. |

FOREIGN PATENT DOCUMENTS

| | | |
|---|---|---|
| CN | 105612439 A | 5/2016 |
| CN | 106744649 A | 5/2017 |
| CN | 109150135 A | 1/2019 |
| EP | 2096448 A2 | 9/2009 |
| EP | 1577656 B1 | 6/2010 |
| EP | 2789578 A2 | 10/2014 |
| EP | 3656478 A1 | 5/2020 |
| JP | 5636555 B2 | 12/2014 |

\* cited by examiner

MICROPUMP MEMS DEVICE FOR MOVING OR EJECTING A FLUID, IN PARTICULAR MICROBLOWER OR FLOWMETER

BACKGROUND

Technical Field

The present disclosure relates to a micropump MEMS device for moving or ejecting a fluid, in particular a microblower or flowmeter.

Description of the Related Art

Known micropumps are able of moving small amounts of a fluid, such as a liquid or a gas, to cool small components, to supply specific gas molecules for administering medicines, or to perform flow analyses. In particular, some known micropump devices exploit the capacity of piezoelectric materials to deflect a membrane when biased at an appropriate a.c. voltage.

For instance, US 2009/0232683 describes a piezoelectric microblower formed by a stack of appropriately shaped plates, overlapped on each other and bonded, of metal or hard resin. In particular, the microblower described therein comprises a body housing a chamber closed on a first side by a first wall and on an opposite side by a vibrating plate (also of metal or flexible resin, such as an epoxy resin). The vibrating plate is bonded to the body and carries a piezoelectric element. The first wall has a first hole in fluidic contact with a fluid supply path. The supply path is formed by a suitably shaped plate arranged between the first wall and a second wall and has a fluid inlet and a fluid-ejection outlet. The fluid-ejection outlet is formed by a second hole arranged in the second wall so that it is aligned to the first hole.

The piezoelectric element is fixed on the back of the vibrating plate to form a unimorph membrane, which, when the piezoelectric element is biased by an a.c. voltage, bends in opposite directions, with alternating motion, reducing and increasing the volume of the chamber in the body. The above volume variation alternately causes fluid to be drawn from the supply path inlet and discharge thereof through the ejection outlet, in an alternating way.

With this structure, it is thus possible to move small amounts of fluid, larger than 0.2 ml/min, in a precise way; the microblower may thus be used for cooling electronic devices with air.

It is, however, desirable to have micropump devices able of moving, with high precision, amounts of fluid ranging from very low values to higher values.

BRIEF SUMMARY

One or more embodiments of the present disclosure provide a micropump device having a simple and inexpensive structure allowing variable amounts of fluids, from very low to high values, to be moved with high precision.

According to the present disclosure a micropump device and the corresponding manufacturing process are provided.

BRIEF DESCRIPTION OF THE SEVERAL VIEWS OF THE DRAWINGS

For an understanding of the present disclosure, embodiments thereof are now described, purely by way of non-limiting example, with reference to the attached drawings, wherein.

DETAILED DESCRIPTION

Figure 1:
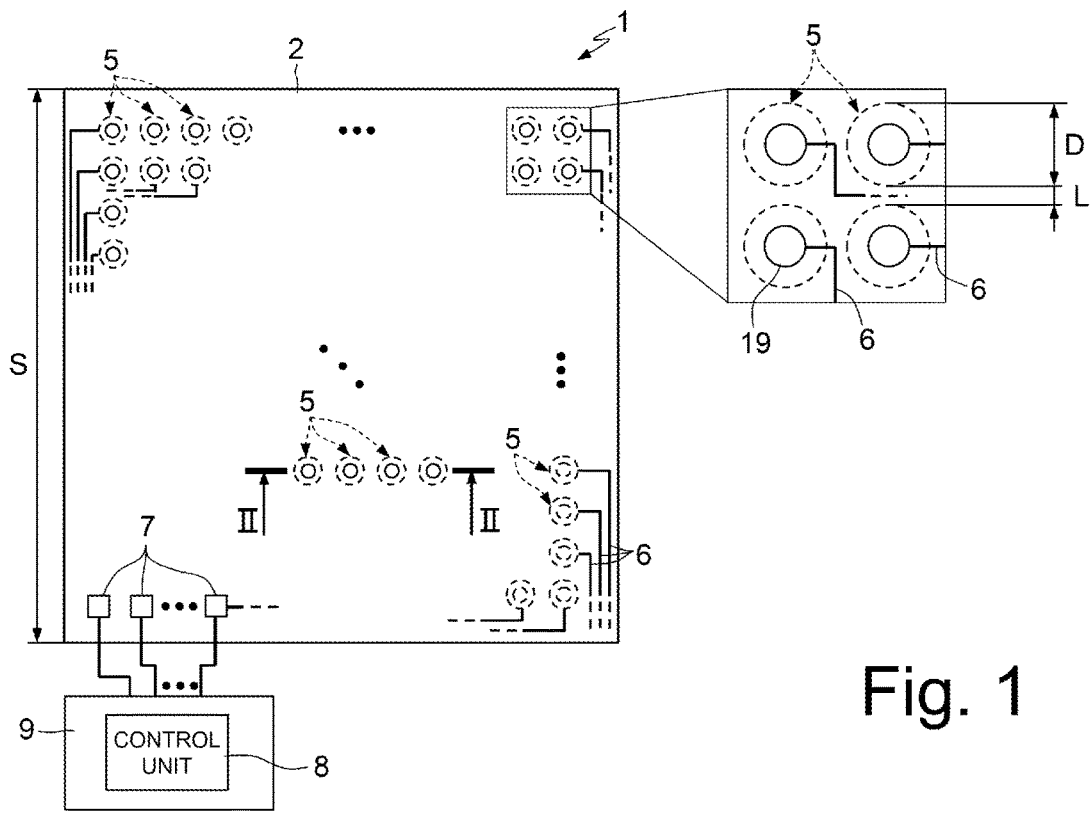
FIG. 1 is a bottom view of an embodiment of the present micropump device.

FIG. 1 shows schematically a micropump device 1 manufactured using the MEMS technology and integrated in a die 2.

The micropump device 1 comprises a plurality of individual actuator elements 5 arranged side-by-side, for example, aligned in rows and columns. In the embodiment of FIG. 1, the actuator elements 5 have a circular shape (see also FIG. 4).

Each actuator element 5 is connected independently, via electrical connections 6 and contact pads 7, shown schematically, to a control unit 8, generally formed in a different die 9, for example, as an ASIC (Application-Specific Integrated Circuit). Alternatively, the actuator elements 5 may be connected in groups, the actuator elements 5 of each group being controlled simultaneously, and the groups may be controlled separately, to reduce the number of electrical connections and thus simplify them.

Figure 2:
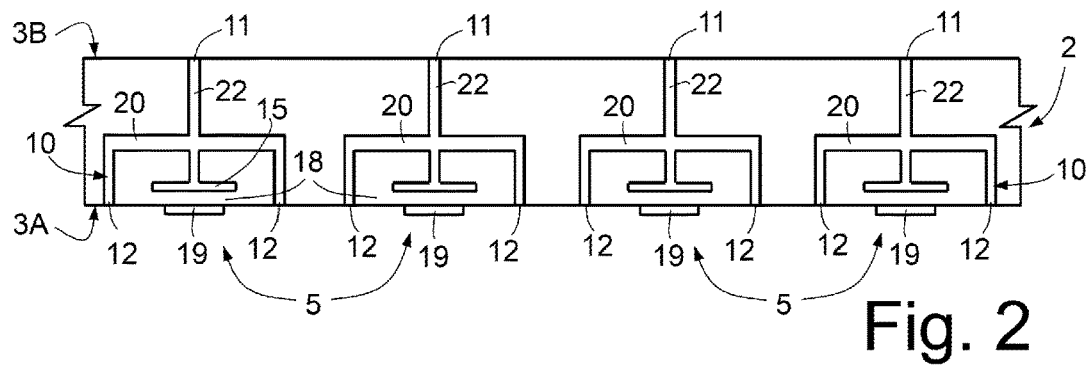
FIG. 2 shows a cross section of a portion of the device of FIG. 1, for a plurality of actuator elements arranged side-by-side.

With reference to FIG. 2, the die 2 comprises a monolithic body 3 of semiconductor material, such as silicon, having a first and a second main face 3A, 3B and forming the plurality of actuator elements 5.

Each actuator element 5 comprises a fluidic inlet path 10 and outlet openings 11. In the illustrated embodiment, the fluidic inlet path 10 opens on the first main face 3A, through inlet openings 12. The outlet openings 11 are arranged on the second main face 3B, here one for each actuator element 5. The inlet openings 12 may be connected to an external fluidic circuit (not illustrated), for example for drawing a liquid or a gas contained in a reservoir, or directly with the external environment, for example for drawing ambient air. Likewise, the outlet openings 11 may be connected to an external fluidic circuit, not illustrated, or to the outside, according to the envisaged application.

Figure 3:
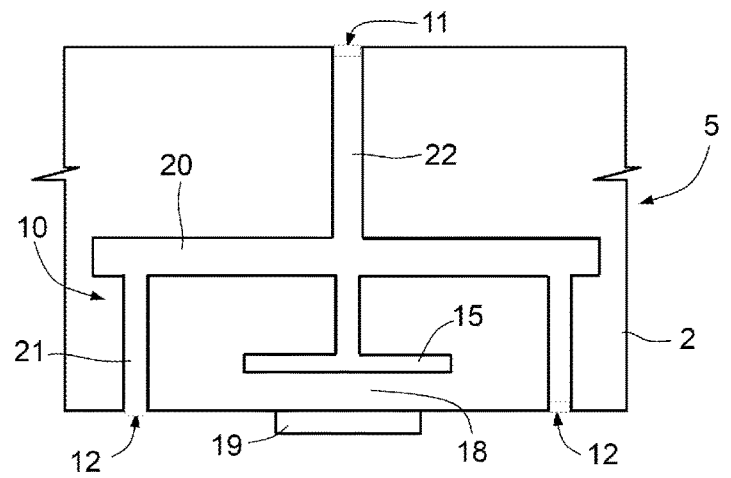
FIG. 3 is an enlarged cross-section of a portion of the device of FIG. 1, for a single actuator element.

As illustrated in detail in FIG. 3, each actuator element 5 further comprises a first chamber 15, arranged in proximity of the first main face 3A of the monolithic body 3; a second chamber 20, extending between the first chamber 15 and the second main face 3B of the monolithic body 3; inlet trenches 21, extending between the inlet openings 12 and the second chamber 20; and outlet trenches 22, extending between the first chamber 15 and the outlet openings 11.

The portion between each chamber 15 and the first main face 3A of the die 2 forms a membrane 18 and a piezoelectric element 19 is arranged on each membrane 18, on the first main face 3A.

The first and second chambers 15, 20 here have a circular shape, with centers aligned to each other along a central axis 25. The membrane 18 is thus circular, concentric to the chambers 15, 20. Moreover, the second chamber 20 has an area (in top plan view, see FIG. 4) greater than the first chamber 15 so that a peripheral area thereof, here circular ring-shaped, laterally projects from the first chamber 15, and the inlet trenches 21 may extend vertically, perpendicular to the first and the second main faces 3A, 3B of the body 3, between the inlet openings 12 and the second chamber 20.

Figure 4:
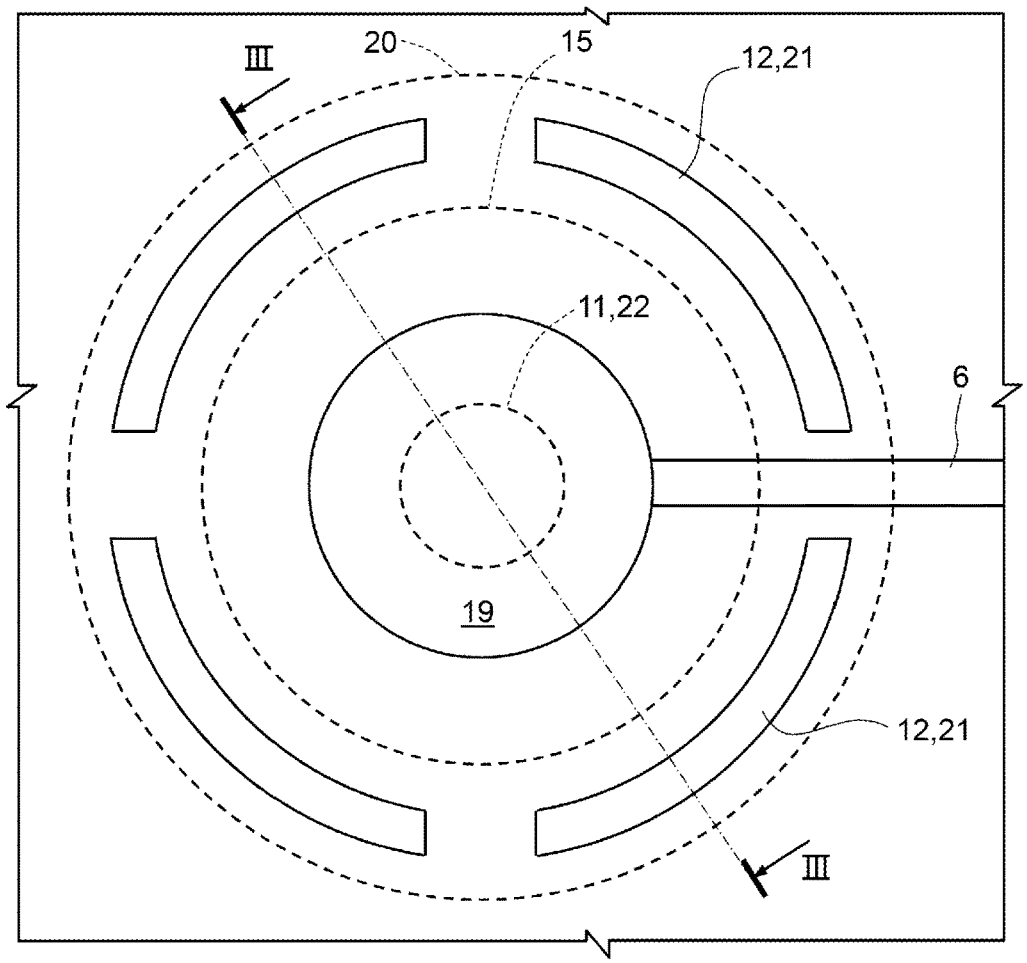
FIG. 4 is an enlarged bottom view of the actuator element of FIG. 3.

In the illustrated embodiment, the inlet openings 12 are four for each actuator element 5, are arched and annulus sector-shaped, circumferentially aligned to each other (see, in particular, FIG. 4). The inlet trenches 21 here have the same shape and area (in top plan view) of the inlet openings 12, have an inner diameter greater than the first chamber 15 and surround the latter at a distance.

The outlet trench 22 (one for each actuator element 5) has a cylindrical shape parallel and concentric to the central axis 25 of the respective actuator element 5, has the same area (in top plan view) as the respective outlet opening 11, and extends through the second chamber 20.

Figure 5:
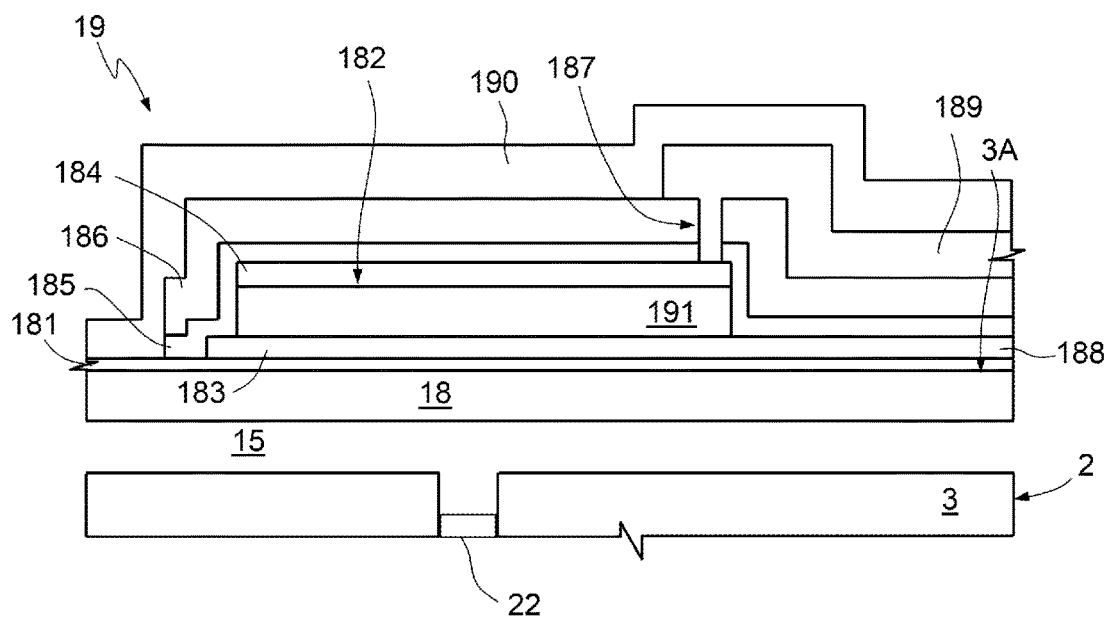
FIG. 5 is an enlarged cross-section of a portion of the actuator element of FIG. 3.

The piezoelectric element 19 may have the structure illustrated in the cross-section of FIG. 5.

In detail, the piezoelectric element 19 is formed on an insulating layer 181, for example formed by superposing a thermally grown silicon oxide layer and a dielectric layer, as discussed in detail hereinafter with reference to FIGS. 6A-6I, and covers the entire first main face 3A of the body 3. The piezoelectric element 19 includes a stack 182 that extends over the insulating layer 181 and is formed by a bottom electrode 183, of electrically conductive material, for example titanium (Ti) or platinum (Pt); a thin-film piezoelectric region 191; and a top electrode 184, for example of TiW. The bottom electrode 183 is in electrical contact with a first contact line 188 (for example, it is formed in the same layer and shaped using known photolithographic steps). First and second dielectric layers 185, 186, for example of silicon oxide and silicon nitride deposited by CVD (Chemical Vapour Deposition) extend over the stack 182. A second contact line 189 of conductive material, for example, aluminum and/or copper, extends on the dielectric layers 185, 186 and in an opening 187 thereof, to electrically contact the top electrode 184. A passivation layer 190, for example of silicon oxide and/or silicon nitride deposited by CVD, covers the entire first main surface 3A of the die 2, except for the inlet openings 12 and the electrical connection openings (on the contact pads 7). In practice, the contact lines 188, 189 form the electrical connections 6 of FIG. 1 and enable electrical connection of one of the electrodes 183, 184 (for example, the bottom electrode 183 of all the actuator elements 5) to a reference potential, typically to ground, and biasing of the other one of the electrodes 183, 184 (for example, the top electrode 184) at an a.c. driving voltage, as explained above.

The micropump device 1 operates in a way similar to known devices. In fact, application of an a.c. driving voltage between the top and bottom electrodes 183, 184, for example of 40 V, causes contraction and expansion of the thin-film piezoelectric region 191 and deflection of the membrane 18 in a vertical direction, alternately moving away from and towards the second chamber 20, causing a corresponding volume increase and decrease of the first chamber 15. This volume variation causes the fluid in the inlet trench 21 and in the second chamber 20 to be drawn into the first chamber 15 and then ejected through the outlet trench 22 and the outlet opening 11.

The micropump device 1 can be manufactured as described hereinafter with reference to FIGS. 6A-6I, which show manufacturing of an individual actuator element 5, and the other actuator elements 5 of the device 1 are formed simultaneously, alongside each other, in a not shown way.

Figure 6A:
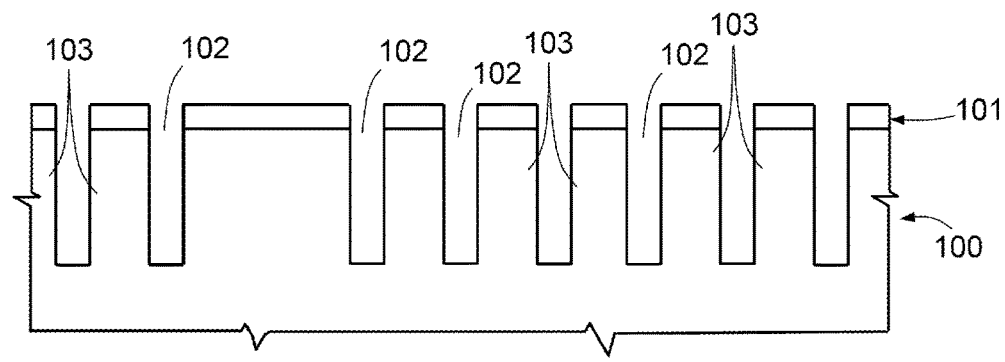
FIGS. 6A-6I are cross-sections of an actuator element, similar to FIG. 4, in successive manufacturing steps.

Initially, FIG. 6A, in a wafer 100 of semiconductor material, for example monocrystalline silicon, the second chamber 20 of each actuator element is formed. For instance, to this end, the manufacturing process described in U.S. Pat. No. 8,173,513 and summarized briefly below may be used. U.S. Pat. No. 8,173,513 is hereby incorporated by reference in its entirety.

In detail, on the wafer 100 a resist mask 101 is formed having openings with honeycomb lattice. Using the mask 101, an anisotropic chemical etch of the wafer 100 is carried out to form a plurality of communicating trenches 102, having a depth of, for example, 15 µm, communicating with each other and delimiting a plurality of silicon columns 103.

Figure 6B:
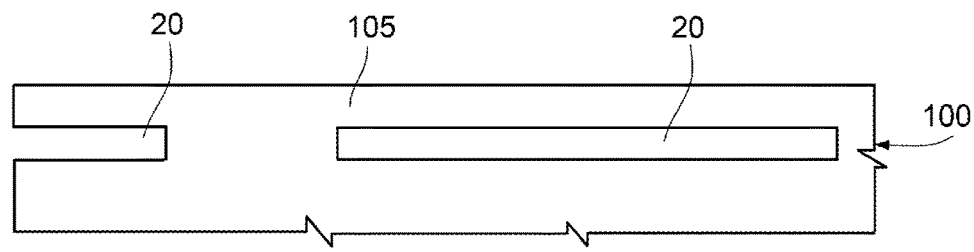

Then, FIG. 6B, the mask 101 is removed and an epitaxial growth is carried out in a reducing environment. Consequently, an epitaxial layer, for example of an N type and having a thickness of 30 µm, grows on the columns 103, closing the trenches 102 at the top.

An annealing step is then performed, for example for 30 minutes at 1190° C., preferably in a hydrogen atmosphere or, alternatively, in a nitrogen atmosphere.

As discussed in the above patents, the annealing step causes migration of the silicon atoms, which tend to move into a lower energy position. Consequently, also by virtue of the short distance between the columns 103, the silicon atoms thereof migrate completely, and the second chambers 20 are formed. A thin layer of silicon remains above the second chambers 20, formed in part by epitaxially-grown silicon atoms and in part by migrated silicon atoms, and forms a closing layer 105 of monocrystalline silicon.

Figure 6C:
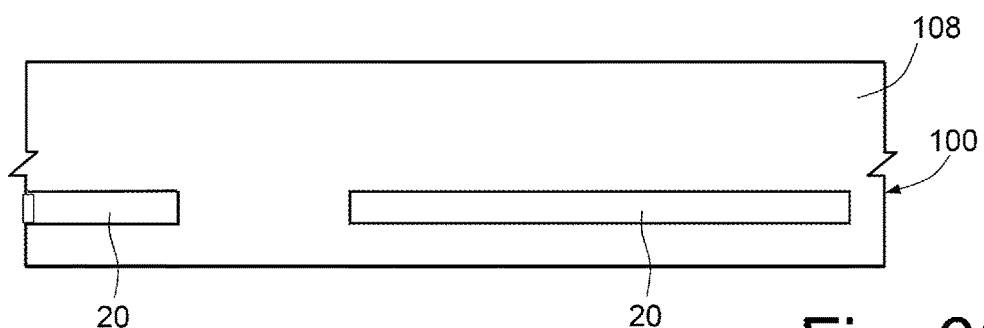

Next, FIG. 6C, another epitaxial growth is carried out for a thickness of a few tens of micrometers, for example 50 µm, from the closing layer 105. In this way, the wafer 100 comprises a first thick region 108 of monocrystalline silicon that overlaps the second chambers 20.

Figure 6D:
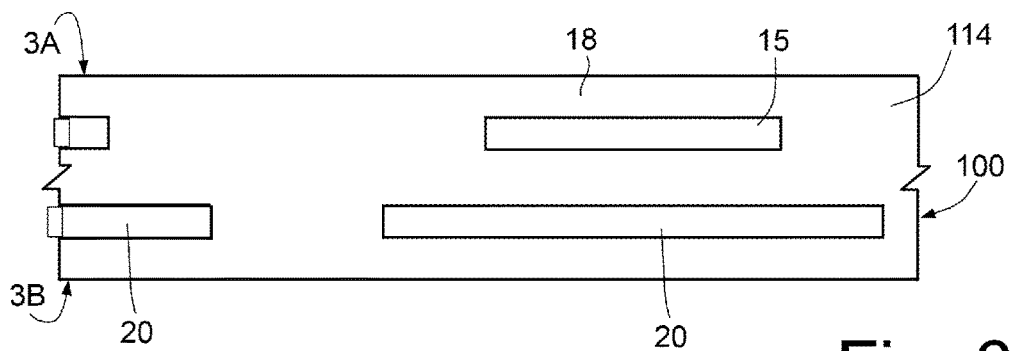

Then, FIG. 6D, the first chambers 15 are formed in the first thick region 108, for example by repeating the manufacturing process described in U.S. Pat. No. 8,173,513 and discussed previously with reference to FIGS. 6A and 6B. In this way, the wafer 100 has a first face and a second face corresponding to the first and second main faces 3A, 3B of the body 3 and accommodates, above the second chambers 20, the first chambers 15 and the membranes 18.

Figure 6E:
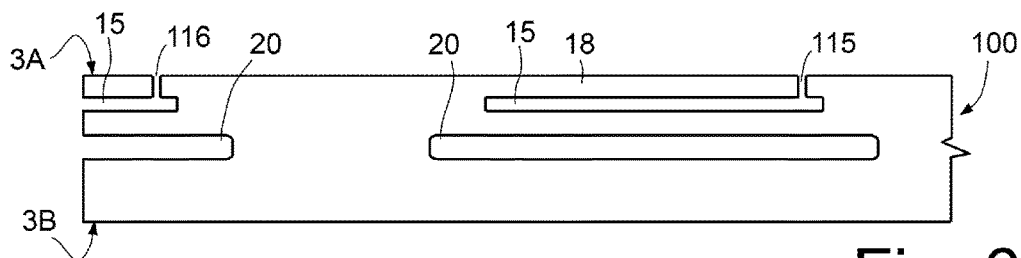

Next, FIG. 6E, using a masking layer (not shown), holes 115 are formed, one for each first chamber 15, each hole 115 extending from the first face 3A of the wafer 100 to the respective first chamber 15. The holes 115, having a diameter of, for example, 2 µm, are preferably formed in proximity of an outer edge of the respective membranes 18 so as not to alter the elastic characteristics thereof.

Figure 6F:
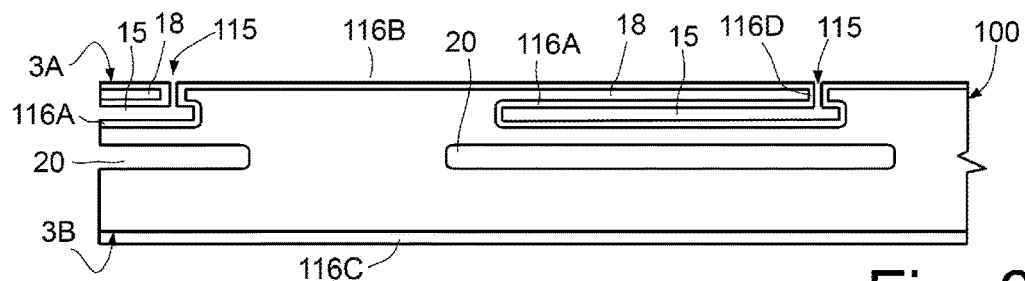

Then, FIG. 6F, a thermal oxidation is carried out to form an oxide layer having a thickness, for example, of 1 µm. In particular, a coating oxide portion 116A is formed on the sides of each of the first chambers 20, a first and a second surface-oxide portion 116B, 116C are formed on the faces 3A and 3B, respectively, of the wafer 100, and a closing oxide portion 116D is formed within each of the holes 115. The first chambers 20 are thus completely covered by the coating oxide portions 116A, and the holes 115 are practically closed by the closing oxide portions 116D.

Figure 6G:
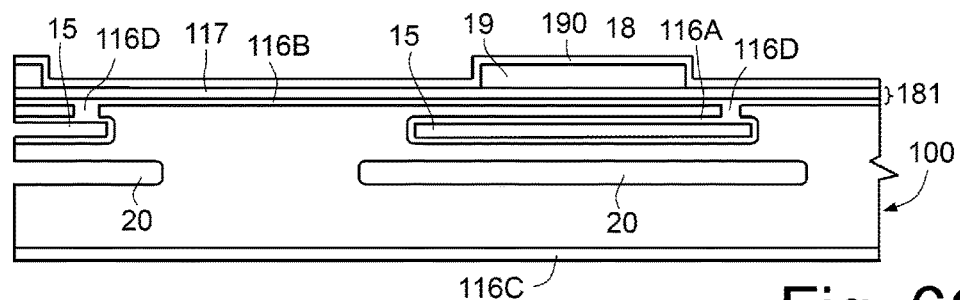

Then, FIG. 6G, a dielectric material layer 117, for example of TEOS (tetraethylorthosilicate), is deposited on the first surface-oxide portion 116B and, together with the first surface portion 116B, forms the insulating layer 181 of FIG. 5. The dielectric material layer 117 may have, for example, a thickness of 1 µm.

Then, the piezoelectric elements 19 are formed on the dielectric material layer 117. For instance, with reference to FIG. 5, the electrodes 183 and the first contact lines 188 are first formed using known deposition and masking techniques. Then, a thin-film piezoelectric layer (for example of PZT—Pb, Zr, TiO$_3$) and an electrode layer are deposited in succession and are defined using known masking and definition techniques so as to form the thin-film piezoelectric regions 191 and the top electrodes 184. Then, the first and second dielectric layers 186, 186 are deposited and defined, to form the openings 187; the second contact lines 189 are formed, and the passivation layer 190 is deposited and defined, then opened on the contact pads (not shown) and where the trenches 21 are to be formed.

Figure 6H:
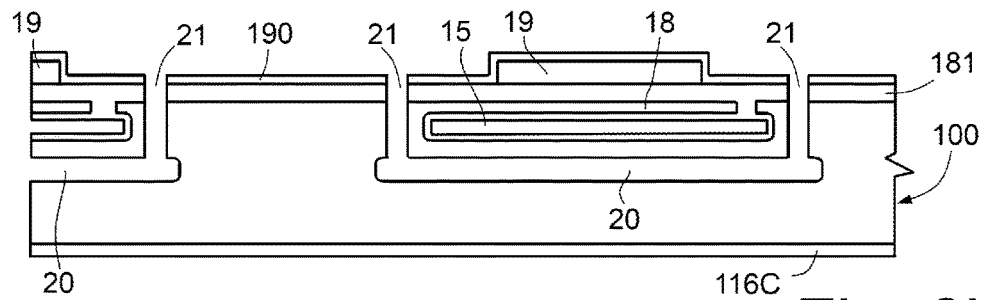

Next, FIG. 6H, silicon is deep etched from the front side, through the passivation layer 190 (not shown) and the insulating layer 181 is removed on the outside of the first chambers 15, as far as the second chambers 20, to form the inlet trenches 21 and the inlet openings 12.

Figure 6I:
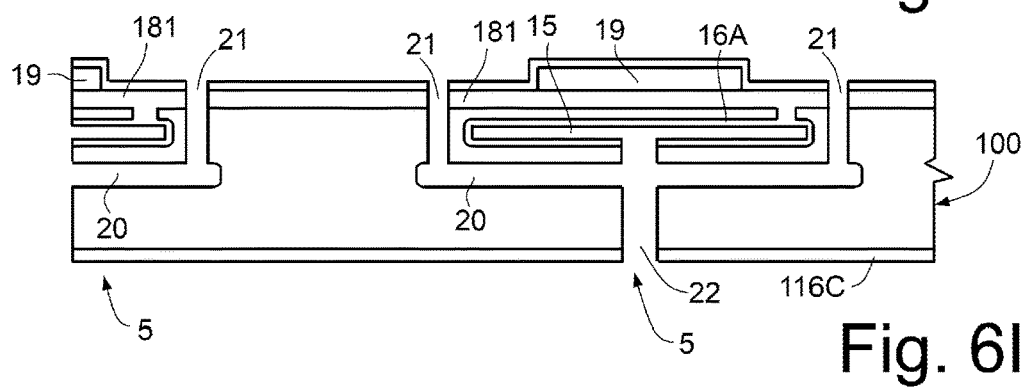

Then, FIG. 6I, silicon is deep etched from the back, through the second surface-oxide portion 116C, as far as the second chambers 20, to form the outlet trenches 22 and the outlet openings 11. In this step, the coating oxide portions 116A operate as etch stop.

After performing final manufacturing steps, including contact opening and wafer 100 dicing, the micropump device 1 of FIGS. 1-4 is obtained.

In this way, a micropump device 1 may be obtained having small outer dimensions and high flexibility and versatility, in particular for moving adjustable fluid volumes.

For instance, with the described solution, it is possible to manufacture a die 2 having a side S=20 mm comprising 1600 (40×40) actuator elements 5, each having a diameter D (dimension of the second chamber 20, see FIG. 1) of 460 µm and arranged at a distance L of 40 µm. The thickness of the die 2 (thickness of the body 3) may be of 350 µm.

Moreover, in each actuator element 5 the first chamber 15 may have a diameter of 350 µm and a thickness of 3.5 µm, the second chamber 20 may have a diameter of 460 µm (as already mentioned) and a thickness of 3 µm, the distance between the first chamber 15 and the second chamber 20 may be of 10 µm and the membrane 18 may have, for example, a thickness of approximately 6 µm. The inlet hole 12 (inlet trench 21) may have a diameter of 10 µm, and the outlet hole 11 (outlet trench 22) may have a diameter of 13 µm. The thin-film piezoelectric region 191 may have a thickness of 2 µm, and the piezoelectric element 19 may have a total thickness comprised between 2.1 µm and 3 µm.

With the dimensions referred to above, each actuator element 5, when biased at 40 V, is able to generate a flow of 0.026 l/min, and the micropump device 1 can generate a total flow of up to 41 l/min. By virtue of the possibility of controlling the actuator elements 5 individually or in groups, however, the micropump device 1 is able to control, in a precise way, intermediate flow values between the unit flow referred to above (0.026 l/min) and the total flow (41 l/min). Moreover, the minimum and maximum flow values may also be increased or reduced by modifying the driving voltage applied between the top and bottom electrodes 183, 184. For instance, by lowering the driving voltage to 20 V, it is possible to halve the flow, thus obtaining a minimum value of approximately 0.01 l/min, and, by reducing it to 10 V, a minimum value of approximately 0.005 l/min is obtained.

Monolithic formation of a plurality of actuator elements within a monolithic body of semiconductor material thus enables precise regulation of flow ranging from very low values to high values.

From the simulations conducted by the present applicant, it has moreover been found that the micropump device 1 has an excellent reliability and the structure is able to withstand stresses generated also by simultaneous actuation of all the actuator elements 5, with ample safety margin.

The values referred to above are, however, only indicative, and in particular the shape and dimensions of the chambers 15, 20 may vary widely, according to the application and the desired flow volumes.

Figure 7:
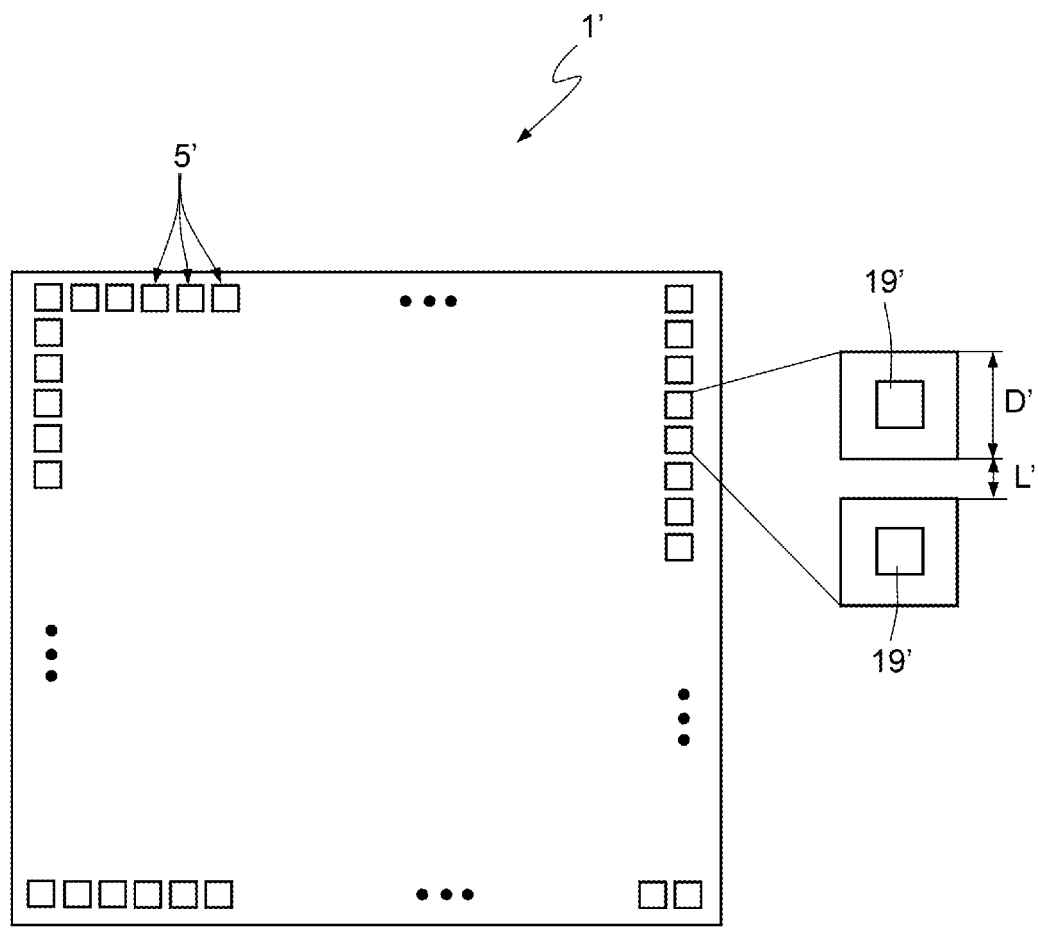
FIG. 7 is a bottom view of a different embodiment of the present micropump device.

For instance, according to a different embodiment, FIG. 7, the micropump device, designated by 1', comprises a plurality of actuator elements 5' having a quadrangular shape, for example a square shape, with a side D'=350 µm (side of the second chamber 20), arranged at a distance L'=40 µm. Also the piezoelectric element, designated by 19', is here square. Other shapes (for example oval, hexagonal, octagonal, etc.) and other dimensions are, however, possible.

The described micropump device may be used in a plurality of applications, where controlled movement of fluids (liquids or gases) is desired in variable and well-controlled amounts or where it is desired to measure flow. For instance, the present micropump device may form a microblower usable as a flowmeter, in gas sensors, or in medical applications, for example for treating sleep apnoea.

Finally, it is clear that modifications and variations may be made to the micropump device and to the manufacturing process described and illustrated herein, without thereby departing from the scope of the present disclosure.

For instance, the inlet trenches 21 and the outlet trenches 22 may be formed in a reversed with respect to what illustrated in FIGS. 6H and 6I.

Moreover, the shape of the inlet trenches 21 and of the inlet openings 12 may vary, as their number, and the inlet trenches 21 may be connected to a single supply channel that opens to the outside.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A micropump device, comprising
a monolithic body of semiconductor material having a first face and a second face; and
a plurality of actuator elements integrated in the body and arranged side-by-side, wherein each actuator element includes:
a first chamber extending in the monolithic body at a distance from the first face;
a membrane formed by a portion of the monolithic body that is between the first face and the first chamber;
a piezoelectric element extending on the first face of the monolithic body on the membrane;
a second chamber extending in the monolithic body between the first chamber and the second face;
a plurality of fluidic inlet paths that fluidically connects the second chamber with the outside of the monolithic body, the plurality of fluidic inlet paths are transverse to the second chamber, and each fluidic inlet path of the plurality of fluidic inlet paths is separate from adjacent fluidic inlet paths of the plurality of fluidic inlet paths, each of the fluidic inlet paths of the plurality of fluidic inlet paths includes:
an inlet opening arranged on the first face of the monolithic body, the inlet opening having an arched shape;
a fluid-outlet path extending in a transverse direction in the monolithic body from the second face to the first chamber and through the second chamber, and wherein the inlet openings of the plurality of fluidic inlet paths curve and extend around the fluid-outlet path.

2. The micropump device according to claim 1, wherein the second chamber laterally projects from the first chamber with a peripheral portion thereof and the fluidic inlet path comprises a trench extending from the inlet opening to the peripheral portion of the second chamber.

3. The micropump device according to claim 1, wherein the second chamber has a greater area than the first chamber and laterally projects beyond the first chamber with a peripheral area thereof, and each of the fluidic inlet paths further comprises an inlet trench communicating with the inlet opening, respectively, each of the inlet trenches extending from the respective inlet opening to the peripheral area of the second chamber.

4. The micropump device according to claim 3, wherein the inlet trenches have the arched shape and laterally surround the first chamber at a distance.

5. The micropump device according to claim 1, wherein the first and the second chambers have a circular shape.

6. The micropump device according to claim 1, wherein the first and the second chambers have a polygonal shape.

7. The micropump device according to claim 1, wherein the piezoelectric element comprises a layer stack including a first electrode and a second electrode and a thin-film piezoelectric region arranged between the first and the second electrodes.

8. The micropump device according to claim 7, comprising a plurality of electrical connection lines configured to selectively couple at least one of the first and the second electrodes of one or more of the actuator elements to a driving-voltage generator.

9. The micropump device according to claim 1, wherein the second chamber overlaps each one of the plurality of fluidic inlet paths and extends laterally outward from each one of the plurality of fluidic inlet paths.

10. A process for manufacturing a micropump device, comprising:
forming a plurality of actuator elements arranged adjacent to each other in a semiconductor material wafer, including:
forming a plurality of first buried cavities in a semiconductor material wafer, the first buried cavities being arranged side-by-side;
forming a plurality of second buried cavities in the semiconductor material wafer, each second buried cavity having a respective first buried cavity, of the plurality of first buried cavities, extending thereover, the second buried cavities extend underneath a first face of the semiconductor material wafer, the semiconductor material wafer forming a plurality of membranes between the first face, and the second buried cavities and the first buried cavities extending between a second face of the semiconductor material wafer and the respective first buried cavity;
forming a plurality of fluidic inlet paths configured to couple the first buried cavities with the outside of the semiconductor material wafer, thereby the first buried cavities define intake chambers configured to draw in a fluid from outside;
forming a plurality of fluid outlet paths configured to couple the first and the second buried cavities with the second face of the semiconductor material wafer, thereby the second buried cavities define variable-volume chambers; and
forming a plurality of piezoelectric elements, each piezoelectric element extending on the first face over respective first and second buried cavities of the pluralities of first and second cavities.

11. The process according to claim 10, wherein forming the plurality of fluid outlet paths comprises removing selective portions of the semiconductor material wafer from the second face and extending through the respective first buried cavities, as far as the respective second buried cavities.

12. The process according to claim 10, wherein each first buried cavity projects laterally beyond the respective second buried cavity with a peripheral portion thereof and wherein forming the plurality of fluidic inlet paths comprises, for each intake chamber, forming at least one inlet trench extending from the first face of the semiconductor material wafer as far as the peripheral portion of the intake chamber.

13. The process according to claim 10, wherein:
forming the plurality of first buried cavities comprises forming a plurality of groups of first trenches, the first trenches of each group being separated from each other by first column structures in the semiconductor material wafer; epitaxially growing a first semiconductor surface layer in a reducing environment, the first semiconductor surface layer closing the first trenches; and performing a thermal treatment to cause migration of atoms of the semiconductor material of the first column structures and formation of the plurality of first buried cavities; and
forming the plurality of second buried cavities comprises epitaxially growing a thick region of semiconductor material; forming a plurality of groups of second trenches, the second trenches of each group being separated from each other by second column structures in the thick region; epitaxially growing a second semiconductor surface layer in a reducing environment, the second semiconductor surface layer closing the second trenches; and performing a thermal treatment to cause migration of atoms of the semiconductor material of the second column structures and formation of the plurality of second cavities and of the plurality of membranes.

14. The process according to claim 10, comprising, before forming the plurality of fluid outlet paths, forming a plurality of holes extending from the first face of the semiconductor material wafer as far as a respective second buried cavity and forming an oxide layer coating the second buried cavities and closing the plurality of holes.

15. The process according to claim 10, further comprising forming a plurality of electrical connections extending at least partially on the first face of the semiconductor material wafer and configured to electrically connect the piezoelectric elements with electrical contact regions.

16. A micropump device, comprising
a monolithic body of semiconductor material having a first face and a second face; and an actuator element integrated in the body, the actuator element including:
  a first chamber extending in the monolithic body at a distance from the first face;
  a membrane formed by a portion of the monolithic body that is between the first face and the first chamber;
  a piezoelectric element extending on the first face of the monolithic body on the membrane;
  a second chamber extending in the monolithic body between the first chamber and the second face;
  a plurality of fluidic inlet paths that fluidically connects the second chamber with the outside of the monolithic body, the plurality of fluidic inlet paths are transverse to the second chamber, each fluidic inlet path of the plurality of fluidic inlet paths is separate from adjacent fluidic inlet paths of the plurality of fluidic inlet paths, each of the fluidic inlet paths of the plurality of fluidic inlet paths includes:
    an inlet opening arranged on the first face of the monolithic body, the inlet opening having an arched shape;
  a fluid-outlet opening path in a transverse direction in the monolithic body from the second face to the first chamber and through the second chamber, and wherein the inlet openings of the plurality of fluidic inlet paths curve and extend around the fluid-outlet opening path.

17. The micropump device according to claim 16, wherein the second chamber laterally projects from the first chamber with a peripheral portion thereof and the fluidic inlet path comprises a trench extending from the inlet opening to the peripheral portion of the second chamber.

18. The micropump device according to claim 16, wherein the second chamber has a greater area than the first chamber and laterally projects beyond the first chamber with a peripheral area thereof, and each of the fluidic inlet paths further comprises an inlet trench communicating with the inlet opening, respectively, each one of the inlet trenches extending from the respective inlet opening to the peripheral area of the second chamber.

19. The micropump device according to claim 18, wherein the inlet trenches have the arched shape and laterally surround the first chamber at a distance.

20. The micropump device according to claim 16, wherein the second chamber overlaps each one of the plurality of fluidic inlet paths and extends laterally outward from each one of the plurality of fluidic inlet paths.

\* \* \* \* \*